United States Patent
Chen

(10) Patent No.: US 8,426,279 B2
(45) Date of Patent: Apr. 23, 2013

(54) ASYMMETRIC TRANSISTOR

(75) Inventor: Qiang Chen, Sunnyvale, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1164 days.

(21) Appl. No.: 11/512,000

(22) Filed: Aug. 29, 2006

(65) Prior Publication Data

US 2008/0057635 A1    Mar. 6, 2008

(51) Int. Cl.
*H01L 21/8234* (2006.01)

(52) U.S. Cl.
USPC ........... 438/286; 438/179; 257/213; 257/219; 257/221; 257/262; 257/288; 257/347; 257/E27.112; 257/E29.279

(58) Field of Classification Search ........... 438/197, 438/286, 305, 179; 257/E29.224, E29.279, 257/213, 219, 221, 262, 288, 347, E27.112
See application file for complete search history.

(56) References Cited

U.S. PATENT DOCUMENTS

| | | | |
|---|---|---|---|
| 6,445,016 B1 * | 9/2002 | An et al. | 257/192 |
| 6,744,083 B2 * | 6/2004 | Chen et al. | 257/219 |
| 2001/0019869 A1 * | 9/2001 | Hsu | 438/286 |

* cited by examiner

*Primary Examiner* — Ha Tran T Nguyen
*Assistant Examiner* — Suberr Chi
(74) *Attorney, Agent, or Firm* — Farjami & Farjami LLP

(57) ABSTRACT

According to one exemplary embodiment, an asymmetric transistor includes a channel region having a drain-side channel portion and a source-side channel portion. The asymmetric transistor can be an asymmetric MOSFET. The source-side channel portion can comprise silicon, for example. The drain-side channel portion can comprise germanium, for example. The asymmetric transistor comprises a vertical heterojunction situated between the drain-side channel portion and the source-side channel portion. According to this exemplary embodiment, the bandgap of the source-side channel portion is higher than the bandgap of the drain-side channel portion and the carrier mobility of the drain-side channel portion is higher than the carrier mobility of the source-side channel portion. The transistor can further include a gate oxide layer situated over the drain-side channel portion and the source-side channel portion, and can also include a gate situated over the gate oxide layer.

7 Claims, 3 Drawing Sheets

ASYMMETRIC TRANSISTOR

1. TECHNICAL FIELD

The present invention is generally in the field of semiconductors. More particularly, the invention is in the field of semiconductor transistor structures.

2. BACKGROUND ART

There is a continual effort to increase the performance of transistors, such as MOSFETs, that are used in integrated circuits (ICs) in modern electronic devices. An important measure of transistor performance is the amount of current that the transistor can provide when it is in an "on state" (i.e. turned on), which can be referred to as "drive current." However, drive current is often increased at the expense of "off state" current, which refers to leakage current that the transistor draws when it is in an "off state" (i.e. turned off) and which can cause an undesirable increase in stand-by power consumption of the transistor.

One conventional method for increasing drive current is to lower the threshold voltage of the transistor. However, lowering the threshold voltage to achieve an increase in drive current can cause a higher increase in transistor leakage current, which is undesirable.

SUMMARY

The present invention is directed to an asymmetric transistor. The present invention addresses and resolves the need in the art for a transistor, such as a MOSFET, having increased drive current, where the increased drive current is achieved without increasing leakage current.

According to one exemplary embodiment, an asymmetric transistor includes a channel region having a drain-side channel portion and a source-side channel portion. The asymmetric transistor can be an asymmetric MOSFET. The source-side channel portion can comprise silicon, for example. The drain-side channel portion can comprise germanium, for example. The asymmetric transistor thus comprises a vertical heterojunction situated between the drain-side channel portion and the source-side channel portion. According to this exemplary embodiment, the bandgap of the source-side channel portion is higher than the bandgap of the drain-side channel portion and the carrier mobility of the drain-side channel portion is higher than the carrier mobility of the source-side channel portion. The transistor can further include a gate oxide layer situated over the drain-side channel portion and the source-side channel portion, and can also include a gate situated over the gate oxide layer.

The present invention also comprises a method that achieves one or more embodiments of the asymmetric transistor, and a system that utilizes one or more embodiments of the asymmetric transistor described in the present application. Other features and advantages of the present invention will become more readily apparent to those of ordinary skill in the art after reviewing the following detailed description and accompanying drawings.

DETAILED DESCRIPTION OF THE INVENTION

The present invention is directed to an asymmetric transistor. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
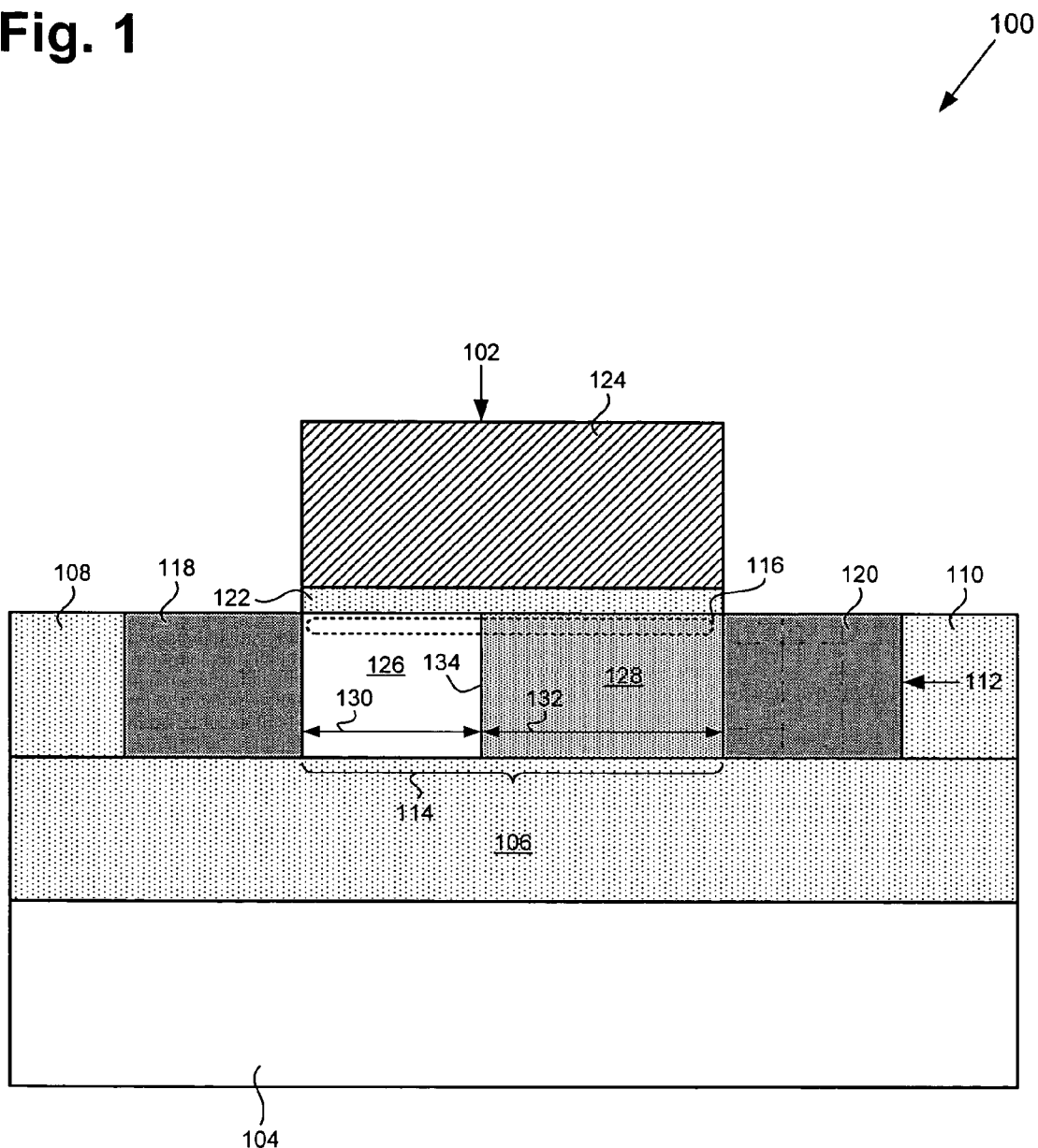
FIG. 1 illustrates a cross sectional view of an exemplary structure including an exemplary asymmetric transistor in accordance with one embodiment of the present invention.

FIG. 1 shows a cross-sectional view of an exemplary structure including an exemplary transistor in accordance with one embodiment of the present invention. Structure 100 includes transistor 102, substrate 104, buried oxide layer 106, and isolation regions 108 and 110. Transistor 102 includes semiconductor layer 112, which includes channel region 114, transistor channel 116, source region 118, and drain region 120, gate oxide layer 122, and gate 124. Transistor 102, which is situated over substrate 104, can be a MOSFET, such as an NMOS or a PMOS transistor, formed in accordance with an embodiment of the invention as described below.

As shown in FIG. 1, buried oxide layer 106 is situated over substrate 104, which can be a silicon substrate. Buried oxide layer 106 isolates semiconductor layer 112 from substrate 104 and can comprise silicon oxide. Buried oxide layer 106 can be formed by thermally growing a layer of silicon oxide on substrate 104, for example. Also shown in FIG. 1, semiconductor layer 112 is situated over buried oxide layer 106 and includes channel region 114, source region 118, and drain region 120. Semiconductor layer 112 can be formed such that channel region 114 is formed between source region 118 and drain region 120. Channel region 114 includes source-side channel portion 126, which is situated adjacent to source region 118, and drain-side channel portion 128, which is situated adjacent to drain region 120.

Source-side channel portion 126 can comprise silicon, for example, and has width 130. However, source-side channel portion 126 does not comprise germanium. Drain-side channel portion 128 comprises a material that is selected such that drain-side channel portion 128 has higher "carrier mobility," which can also have a lower "bandgap" than source-side channel portion 126. "Carrier mobility" refers to the average speed of a carrier, such as an electron or a hole, in a semiconductor, as measured by the average drift velocity of the carrier per unit electric field. "Bandgap" refers to the energy difference between the top of the valence band and the bottom of the conduction band in a semiconductor. In the present embodiment, drain-side channel portion 128 can comprise germanium. In one embodiment, drain-side channel portion 128 can comprise a silicon-germanium compound that comprises a greater number of germanium atoms than silicon atoms. In other embodiments, drain-side channel portion 128 can comprise other materials that have higher carrier mobility, which can also have a lower bandgap than silicon. Drain-side channel portion 128 has width 132, which can be greater than width 130 of source-side channel portion 126. In another embodiment, width 132 of drain-side channel portion 128 may not be greater than width 130 of source-side channel portion 126.

Further shown in FIG. 1, vertical heterojunction 134 is situated between source-side channel portion 126 and drain-side channel portion 128, i.e. is formed where source-side channel portion 126 electrically contacts drain-side channel portion 128. Vertical heterojunction 134 is aligned perpendicular to transistor channel 116, which extends through portions 126 and 128 of channel region 114 in proximity to the gate oxide layer 122 and channel region 114 interface. Also shown in FIG. 1, source region 118 is situated adjacent to source-side channel portion 126 and is also situated over buried oxide layer 106. Source region 118 generally comprises a material similar to source-side channel portion 126. For example, source region 118 can comprise silicon, which can be heavily doped with a suitable N type dopant, for example. Further shown in FIG. 1, drain region 120 is situated adjacent to drain-side channel portion 128 and is also situated over buried oxide layer 106. Drain region 120 generally comprises a material similar to drain-side channel portion 128. For example, drain region 120 can comprise germanium, which can be heavily doped with a suitable N type dopant, for example.

Also shown in FIG. 1, isolation regions 108 and 110 are situated adjacent to source region 118 and drain region 120, respectively, and are also situated over buried oxide layer 106. Isolation regions 108 and 110, which provide electrical isolation between transistor 102 and other devices situated over substrate 104, can comprise silicon oxide and can be shallow trench isolation (STI) regions, for example. Isolation regions 108 and 110 can be formed over buried oxide layer 106 in a manner known in the art. Further shown in FIG. 1, gate oxide layer 122 is situated over channel region 114 and can comprise, for example, silicon oxide, a germanium-based oxide, a high dielectric constant (high-k) oxide, such as hafnium oxide or other suitable high-k oxide, or a silicide, such as hafnium silicide. Gate oxide layer 122 can be formed over channel region 114 by using a suitable deposition process or thermal oxidation process. Also shown in FIG. 1, gate 124 is situated over gate oxide layer 122 and can comprise a layer of polycrystalline silicon (polysilicon), for example. In another embodiment, gate 124 can comprise a layer of metal. Gate 124 can be formed over gate oxide layer 122 by using a suitable deposition process.

During operation, the on/off switching of transistor 102, which is controlled by gate 124, occurs in an area of source-side channel portion 126 that is situated close to source region 118 and gate oxide layer 122. When transistor 102 is in an ON state, carriers, such as electrons, are injected from source region 118 into transistor channel 116 in source-side channel portion 126 and move towards drain 120 in a drift mode. In the drift mode, the carriers are influenced by an electric field which is formed between drain region 120 and source region 118. The drift mode occurs predominantly in a portion of transistor channel 116 that is situated in an area of drain-side channel portion 128 that is situated close to drain region 120.

Since the on/off switching of transistor 102 occurs in source-side channel portion 126, the invention provides a higher bandgap in source-side channel portion 126 (with respect to drain-side channel portion 128) so as to reduce leakage current when transistor 102 is in an OFF state. Also, since the drift mode occurs predominantly in an area of drain-side channel portion 128 that is situated close to drain region 120, the invention provides higher carrier mobility in drain-side channel portion 128 (with respect to source-side channel portion 126) to increase drive current in transistor 102.

Figure 2:
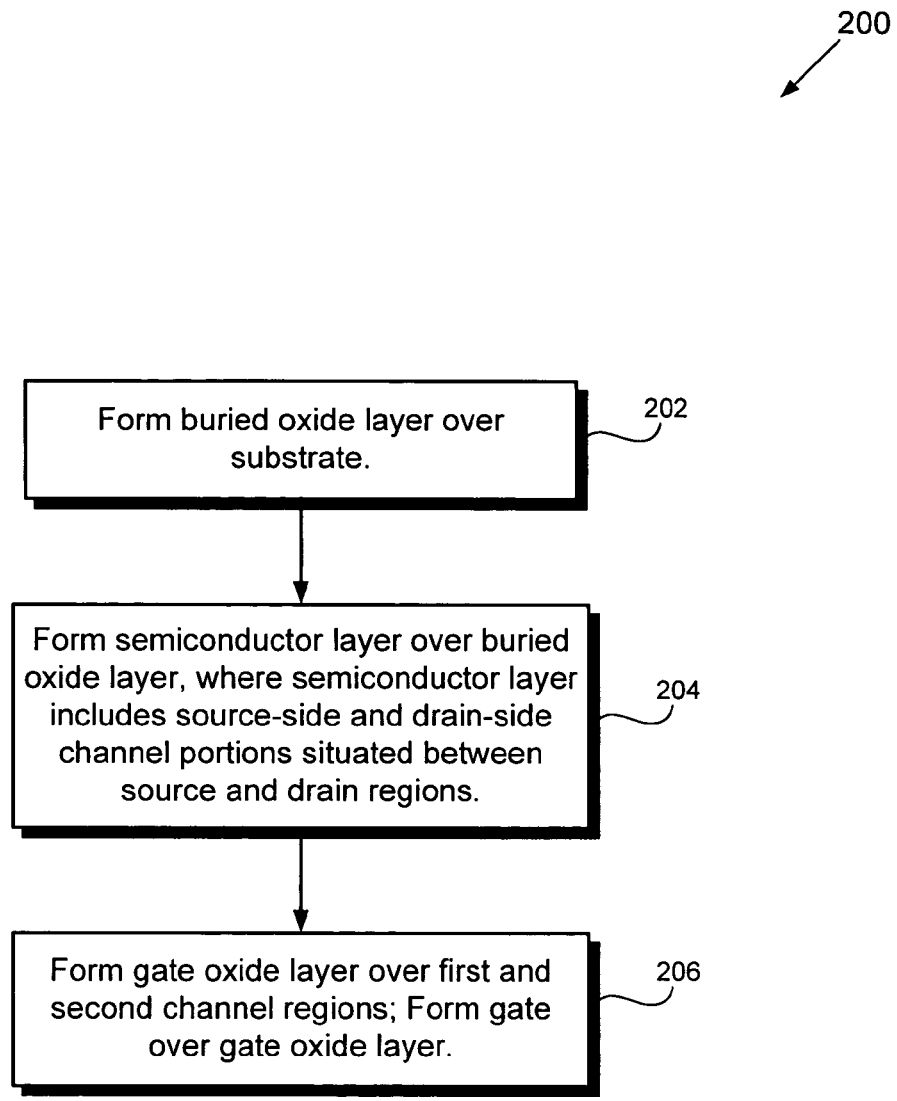
FIG. 2 shows a flowchart illustrating the steps taken to implement an embodiment of the present invention.

FIG. 2 shows a flowchart illustrating an exemplary method according to an embodiment of the present invention. Certain details and features have been left out of flowchart 200 that are apparent to a person of ordinary skill in the art. For example, a step may consist of one or more substeps or may involve specialized equipment or materials, as known in the art.

Referring now to step 202 of flowchart 200 in FIG. 2, buried oxide layer 106 is formed over substrate 104. Buried oxide layer 106 can be formed, for example, by depositing a layer of silicon oxide over substrate 104. At step 204 of flowchart 200, semiconductor layer 112 is formed over buried oxide layer 106, where semiconductor layer 112 includes source-side channel portion 126 of channel region 114 situated adjacent to source region 118 and drain-side channel portion 128 of channel region 114 situated adjacent to drain region 120. Semiconductor layer 112 can be formed such that source-side channel portion 126 has a higher bandgap than drain-side channel portion 128, and drain-side channel portion 128 has a higher carrier mobility than source-side channel portion 126. For example, source-side channel portion 126 can comprise silicon. Drain-side channel portion 128 can comprise germanium or other material having higher carrier mobility, which can also have a lower bandgap than silicon.

At step 206 of flowchart 200, gate oxide layer 122 can be formed over channel portions 126 and 128 of channel region 114 and gate 124 can be formed over gate oxide layer 122. Gate oxide layer 122 can comprise, for example, silicon oxide, a germanium-based oxide, a high dielectric constant (high-k) oxide, such as hafnium oxide or other suitable high-k oxide, or a silicide, such as hafnium silicide. Gate oxide layer 122 can be formed over channel region 114 by using a suitable deposition process, for example. Gate 124 can comprise polysilicon, for example, and can be formed by using a suitable deposition process.

Figure 3:
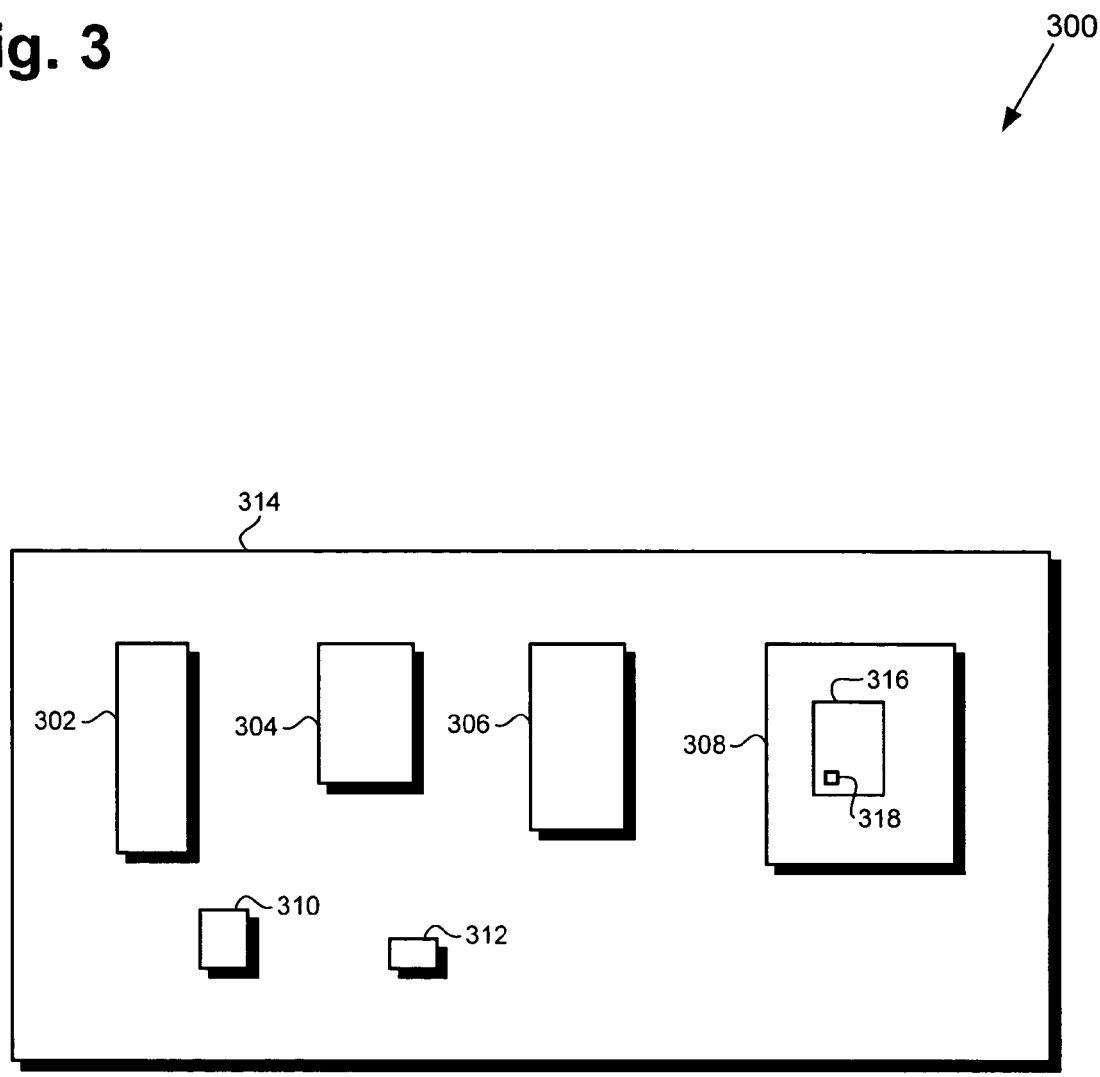
FIG. 3 illustrates a diagram of an exemplary electronic system including an exemplary chip or die utilizing one or more asymmetric transistors in accordance with one embodiment of the present invention.

FIG. 3 illustrates a diagram of an exemplary electronic system including an exemplary chip or die utilizing one or more asymmetric transistors in accordance with one embodiment of the present invention. Electronic system 300 includes exemplary modules 302, 304, and 306, IC chip 308, discrete components 310 and 312, residing in and interconnected through printed circuit board (PCB) 314. In one embodiment, electronic system 300 may include more than one PCB. IC chip 308 includes circuit 316, which utilizes one or more of the invention's asymmetric transistors designated by numeral 318.

As shown in FIG. 3, modules 302, 304, and 306 are mounted on PCB 314 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electro-mechanical motor control module, or a field programmable gate array (FPGA), or any other kind of module utilized in modern electronic circuit boards. PCB 314 can include a number of interconnect traces (not shown in FIG. 3) for interconnecting modules 302, 304, and 306, discrete components 310 and 312, and IC chip 308.

Also shown in FIG. 3, IC chip 308 is mounted on PCB 314 and can be, for example, any chip utilizing an embodiment of the invention's asymmetric transistor. In one embodiment, IC chip 308 may not be mounted on PCB 314, and may be interconnected with other modules on different PCBs. As stated above, circuit 316 is situated in IC chip 308 and includes one or more embodiments of the invention's asymmetric transistor(s) 318. Further shown in FIG. 3, discrete components 310 and 312 are mounted on PCB 314 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor. Discrete components 310 and 312 may themselves utilize one embodiment of the invention's asymmetric transistor.

Electronic system 300 can be utilized in, for example, a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, or a digitally-controlled medical equipment, or in any other kind of system, device, component or module utilized in modern electronics applications.

In a conventional silicon-only transistor, the channel region typically comprises silicon, which determines the carrier mobility and bandgap in the channel region. In the invention, the portion of the channel region situated adjacent to the drain region, which can comprise germanium or silicon-germanium, has higher carrier mobility than the portion of the channel region situated adjacent to the source region, which can comprise silicon. As a result, the invention advantageous achieves a transistor, such as a MOSFET, having higher drive current compared to a conventional silicon-only MOSFET. Furthermore, the present invention achieves a higher drive current, which advantageously provides increased transistor performance, without undesirably increasing leakage current. Thus, the invention advantageously achieves an asymmetric transistor having an increased drive current-to-leakage current ratio compared to a conventional transistor.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, an asymmetric transistor has been described.

The invention claimed is:

1. An asymmetric transistor comprising:
   a semiconductor layer comprising a channel formed between a source and a drain, said semiconductor layer being situated over a buried oxide layer;
   a drain-side channel portion having a higher carrier mobility and a lower band gap than a source-side channel portion, thereby causing said asymmetric transistor to have an increased drive current in an ON state and a low leakage current in an OFF state;
   wherein said drain-side channel portion is in contact with said buried oxide layer and said drain-side channel portion is between said source-side channel portion and said drain.

2. The asymmetric transistor of claim 1, wherein said drain-side channel portion comprises germanium.

3. The asymmetric transistor of claim 2, wherein said source-side channel portion comprises silicon.

4. The asymmetric transistor of claim 1 further comprising a vertical heterojunction situated between said drain-side channel portion and said source-side channel portion.

5. The asymmetric transistor of claim 1 further comprising a gate oxide layer situated over said drain-side channel portion and said source-side channel portion.

6. The asymmetric transistor of claim 5 further comprising a gate situated over said gate oxide layer.

7. The asymmetric transistor of claim 1, wherein said asymmetric transistor is an asymmetric MOSFET.

* * * * *